United States Patent
Deshmukh et al.

(10) Patent No.: US 7,585,784 B1
(45) Date of Patent: Sep. 8, 2009

(54) SYSTEM AND METHOD FOR REDUCING ETCH SEQUENCING INDUCED DOWNSTREAM DIELECTRIC DEFECTS IN HIGH VOLUME SEMICONDUCTING MANUFACTURING

(75) Inventors: Abhay Ramrao Deshmukh, Arlington, TX (US); Satnam Singh Doad, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/869,645

(22) Filed: Jun. 16, 2004

(51) Int. Cl.
*H01L 21/31* (2006.01)
*H01L 21/469* (2006.01)

(52) U.S. Cl. .................... 438/758; 438/720; 438/760; 257/E21.483; 257/E21.582

(58) Field of Classification Search ............... 438/758, 438/760, 716, 720, 905; 257/E21.159, E21.508, 257/E21.483, E21.49, E21.58, E21.582
See application file for complete search history.

(56) References Cited

U.S. PATENT DOCUMENTS

| | | | | |
|---|---|---|---|---|
| 5,849,640 | A * | 12/1998 | Hsia et al. | 438/734 |
| 5,872,060 | A * | 2/1999 | Ashigaki et al. | 438/697 |
| 5,911,887 | A * | 6/1999 | Smith et al. | 216/72 |
| 6,242,355 | B1 * | 6/2001 | Hu et al. | 438/699 |
| 6,394,104 | B1 * | 5/2002 | Chen et al. | 134/1.1 |
| 2002/0111004 | A1 * | 8/2002 | Suzuki et al. | 438/601 |
| 2002/0130383 | A1 * | 9/2002 | Nakamura | 257/506 |
| 2003/0222299 | A1 * | 12/2003 | Miura | 257/306 |

* cited by examiner

Primary Examiner—Caridad M Everhart

(57) ABSTRACT

A system and method is disclosed for reducing etch sequencing induced downstream dielectric defects produced in a SOG planarization process used in high volume semiconductor manufacturing. Three factors have been identified as causes of the defects. The three factors are: (1) phosphorus-doping in the base dielectric, and (2) using for SOG etchback an etch tool that was last used for a bond pad etch process, and (3) residual metal contaminants in the etch chamber used for the SOG etchback. Elimination of any one of these three factors eliminates the defects.

20 Claims, 6 Drawing Sheets

SYSTEM AND METHOD FOR REDUCING ETCH SEQUENCING INDUCED DOWNSTREAM DIELECTRIC DEFECTS IN HIGH VOLUME SEMICONDUCTING MANUFACTURING

TECHNICAL FIELD OF THE INVENTION

The present invention is generally directed to manufacturing technology for integrated circuit devices and, in particular, to a system and method for reducing etch sequencing-induced downstream dielectric defects in high volume semiconductor manufacturing.

BACKGROUND OF THE INVENTION

In the manufacture of semiconductor integrated circuits dry etch tools are often configured for multiple etch processes for better tool utilization. The interaction between processed and residual effects can change process outputs and cause unique defects and problems. It is often the case that the information that is available in prior art books and methods is not helpful in solving some of the unique defects and problems that appear. When confronted with a previously unknown defect or problem, manufacturers of integrated circuits must resort to extensive investigations and testing in order to determine a solution to the problem.

One particular problem occurs when a residual contaminant from an upstream dry etch process interacts with incoming material in a subsequent dry etch process. A complex interaction between the contaminant and the incoming material produces localized defects in a downstream interlevel dielectric (ILD) layer that causes the deposited dielectric to have a number of voids throughout in the manner of a sponge. For this reason the defective dielectric is referred to as having a "spongy" appearance.

Prior art technology does not provide an understanding of a mechanism that causes the formation of a defective spongy dielectric. Therefore, prior art technology is not able to devise an effective method for preventing the formation of a defective spongy dielectric.

Therefore, there is a need in the art for an improved system and method for monitoring, controlling and eliminating the creation of a defective spongy dielectric during the manufacture of semiconductor integrated circuit devices.

SUMMARY OF THE INVENTION

To address the deficiencies of the prior art, it is an object of the present invention to provide a system and method for avoiding defects in dielectric layers deposited during integrated circuit manufacturing.

The present invention comprises a system and method for avoiding dielectric layer defects that can occur during Spin On Glass (SOG) planarization.

For example, in one advantageous embodiment of the present invention, removing any one of a plurality of identified defect-causing factors results in avoidance of the defects.

It is an object of the present invention to provide a system and method for avoiding defects in a SOG upper dielectric layer when a SOG base dielectric layer is doped with phosphorus.

It is also an object of the present invention to provide a system and method for avoiding defects in a SOG dielectric layer deposited after a SOG etchback process has been performed in an etch chamber that contains residual metal contaminants from a previous etch process.

It is yet another object of the present invention to provide a system and method for avoiding defects in a dielectric layer deposited after a SOG etchback process has been performed by an etch tool that was last used to perform a bond pad etch process.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit device.

Figure 1:
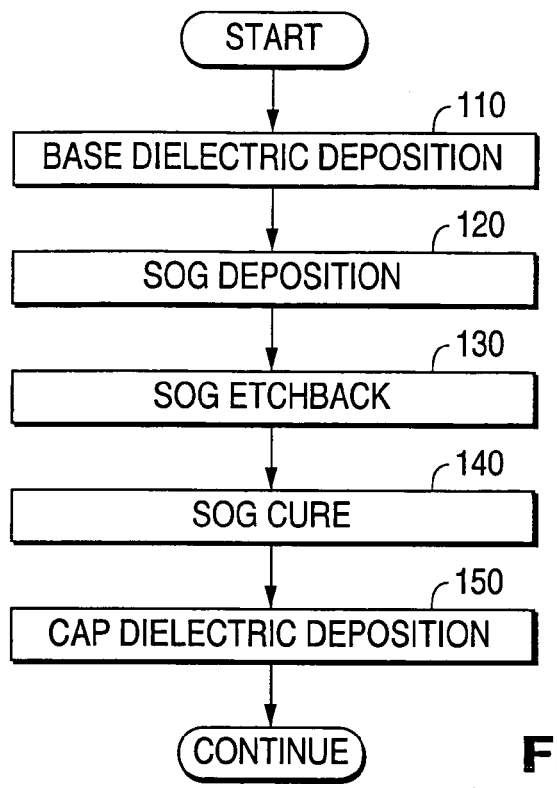
FIG. 1 illustrates a Spin On Glass (SOG) planarization process according to the prior art.

Spin On Glass (SOG) is a planarization technology that is extensively used for integrated circuit device generations that are larger than one half of micron (0.5 μm). A micron is one millionth of a meter. (1.0 μm=$10^{-6}$ m). SOG technology has been described extensively in prior art references and for that reason will not be discussed in detail in this document. Referring to FIG. 1, prior art SOG technology utilizes a method that involves these steps: (1) Deposition of a base dielectric (step 110), (2) SOG deposition (step 120), (3) SOG etchback (step 130), (4) SOG cure (step 140), and (5) Deposition of a cap dielectric (an ILD) to achieve a planar surface (step 150).

Figure 2:
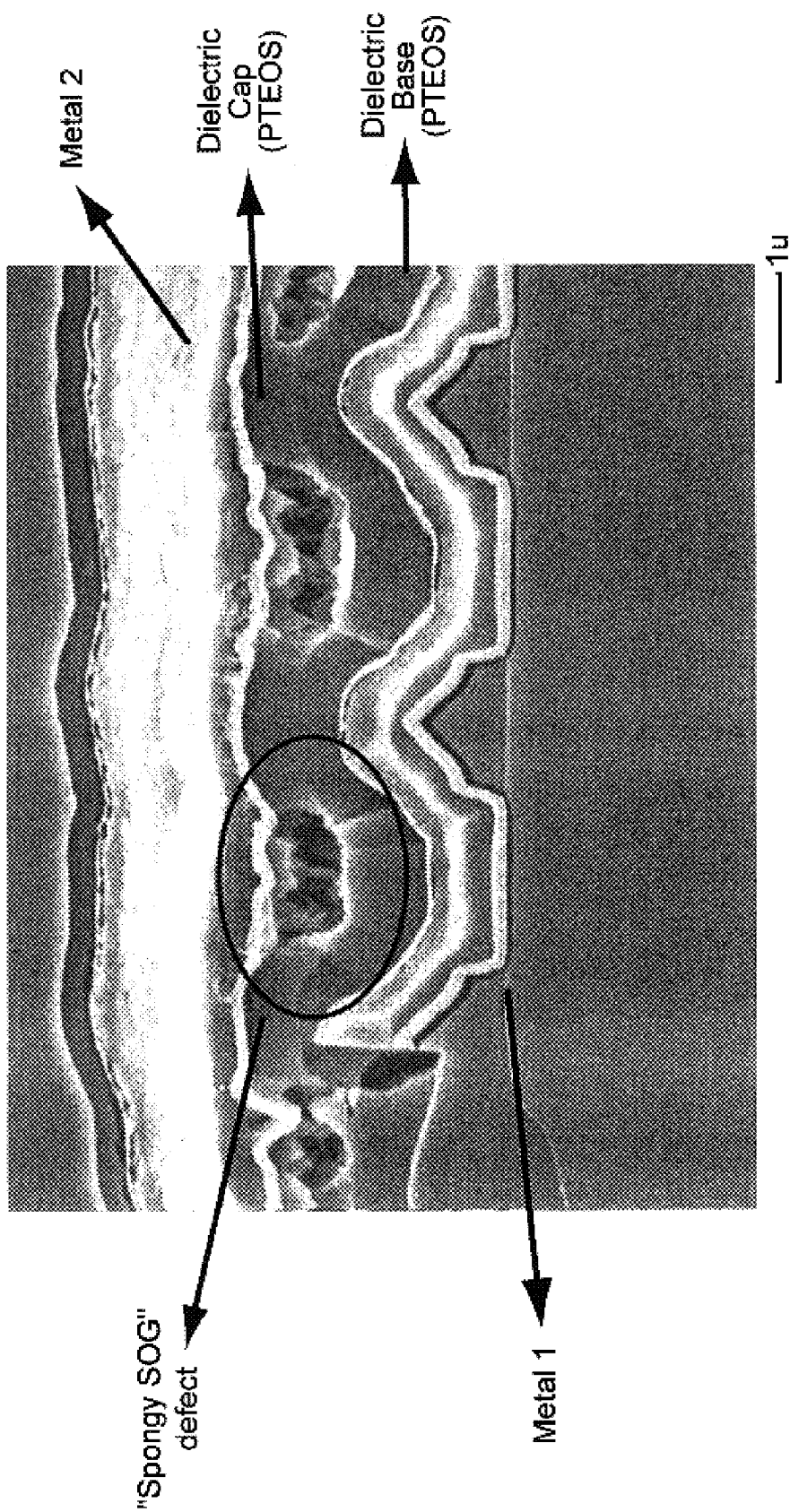
FIG. 2 illustrates a scanning electronic micrograph of exemplary spongy SOG defects.

In investigating the phenomenon of dielectric defects, the inventors of the present invention identified an intermittent yield loss that was related to metal bridging. The metal bridging was caused by unetched metal steps. The unetched metal steps were, in turn, caused by defective cap dielectric material that was spongy (i.e., full of voids). It was noted that the spongy cap dielectric defects were localized and were only located over the SOG pockets. No defects could be found over the non-SOG areas. FIG. 2 illustrates a scanning electronic micrograph of exemplary spongy SOG defects.

The inventors have recognized that when the SOG etchback process (step 130) described with respect to FIG. 1 is performed with a plasma etch tool after that plasma etch tool was last used to perform a bond pad etch process, this is relatively highly correlated to the appearance of the spongy cap dielectric defects. During conventional bond pad etch processing, especially for bond pads with a large percentage transmission at the pad mask, a substantial amount of residual aluminum and titanium contaminant is sputtered from the underlying metal layer and deposited on the chamber walls of the etch tool. This contaminant is resputtered during subsequent etch processes in the etch chamber.

Aluminum contaminant on the etch chamber wall can be particularly gettered during SOG etchback by phosphorus present in the underlying base dielectric (see step 110 of FIG. 1). Accordingly, it is possible that a thin polymeric film is deposited over the SOG pockets during the SOG etchback process. Outgassing from such a polymeric film during the cap dielectric deposition (step 140 of FIG. 1) could then cause the cap dielectric to be spongy.

The inventors have found that the spongy cap dielectric problem can be reduced by employing suitable etch tool segregation, which means excluding from use for SOG etchback any etch tool that was last used to perform a bond pad etch process on another lot of wafers. So any etch tool used to perform the SOG etchback process (see step 130 of FIG. 1) must have been last used to perform an etch process other than a bond pad etch process. This etch tool segregation technique has been found to be successful in reducing the occurrence of spongy cap dielectric layer defects.

The adverse effects of residual metal contaminant in the etch chamber (regardless of the mechanism by which the contaminant is produced) can also be avoided by reducing the amount of residual metal contaminant in the etch chamber prior to the SOG etchback process (step 130 of FIG. 1). For example, with the processing of each SOG etchback wafer, chamber seasoning occurs, so the amount of residual metal contaminant in the etch chamber is reduced as more wafers undergo SOG etchback. Therefore, as any given lot of wafers is processed for SOG etchback, the earliest wafers that are processed will exhibit the spongy cap dielectric defect, but as chamber seasoning occurs and reduces the level of residual metal contaminant in the chamber, the later wafers (e.g., the last half) of the lot do not exhibit spongy cap dielectric defects. Of course, the level of residual metal contaminants within the etch chamber can be reduced by any suitable process, such as processing some dummy wafers or actually cleaning the etch chamber so that occurrences of the spongy cap dielectric defect are reduced in wafers that are processed for SOG etchback in an etch chamber whose level of residual metal contaminants has been reduced.

As discussed above, phosphorus plays a role in gettering aluminum. Moreover, gettering is much more important at the base dielectric, so some conventional SOG planarization processes utilize a phosphorus-doped dielectric (for example, P-TEOS) as the base dielectric. However, exemplary embodiments of the present invention provide for a base dielectric that is not phosphorus-doped (e.g., regular TEOS). A SOG planarization process that utilizes such a non-phosphorus-doped base dielectric does not exhibit the spongy cap dielectric defect, even when the SOG etchback process is performed in a chamber that was last used for a bond pad etch process and in which the level of residual metal contamination resulting from the bond etch process has not been reduced.

The inventors have further recognized that the spongy cap dielectric defect can be effectively avoided by employing any one of the three techniques described above to remove the corresponding one of the three defect-causing factors described above. That is, (1) etch tool segregation can be used to remove the possibility of the SOG etchback process immediately following a bond pad etch process, or (2) residual metal contamination reduction can be used to remove residual metal contaminants that may have been produced in the etch chamber by any number of mechanisms, or (3) a non-phosphorus base dielectric can be used to remove phosphorus from the process. Any one of these three approaches is sufficient, independently of the other two, to reduce substantially the incidence of the spongy cap dielectric defect. Removal of any one of the defect-causing factors can thus compensate for the existence of the other two factors.

The examples in FIGS. 3 through 11 illustrate the independent sufficiency of each of the aforementioned three techniques for avoiding spongy cap dielectric defects.

Figure 3:
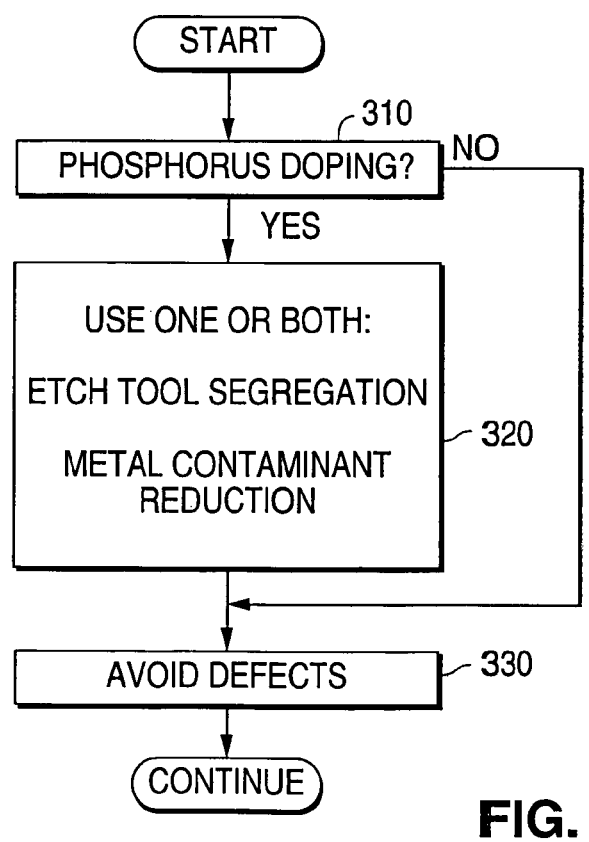
FIG. 3 illustrates exemplary embodiments according to the invention of a method for avoiding defects in an upper dielectric of a SOG planarization when the base dielectric layer is doped with phosphorus.

Referring to FIG. 3, if a non-phosphorus base dielectric is to be used ("No" branch of step 310), then the spongy cap dielectric defect is avoided (Control is passed to step 330). Otherwise, if a phosphorus-doped base dielectric is selected ("Yes" branch at step 310), then either or both of etch tool segregation and/or residual metal contaminant reduction can be used (step 320) to avoid defects (step 330).

Figure 4:
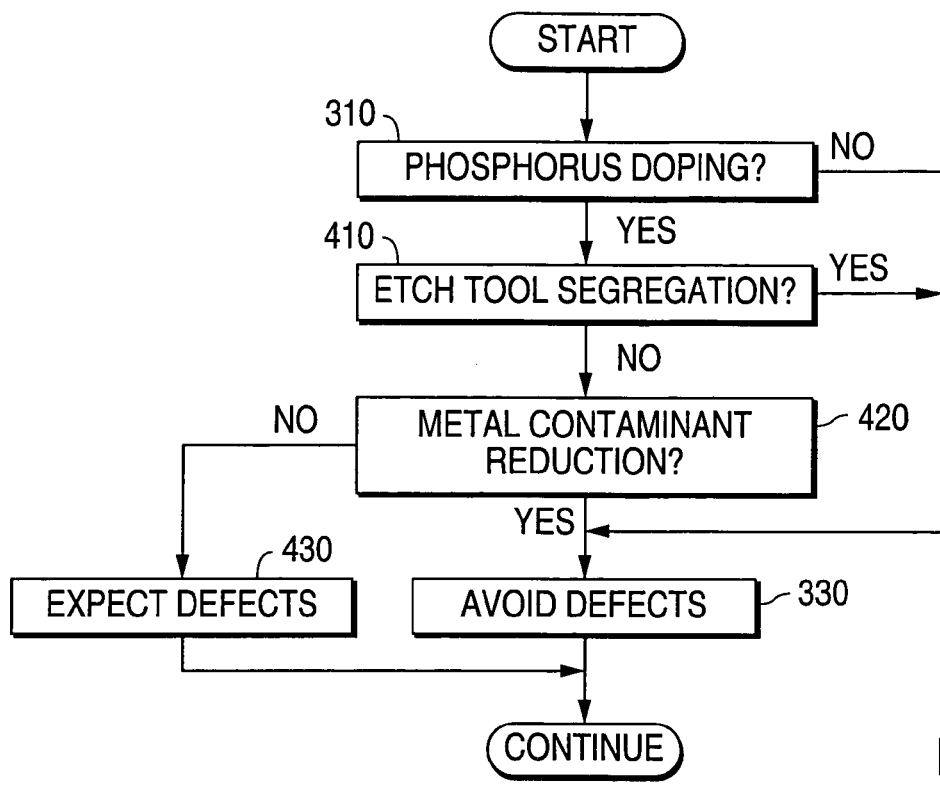
FIG. 4 illustrates more detailed examples of the method shown in FIG. 3.
Figure 5:
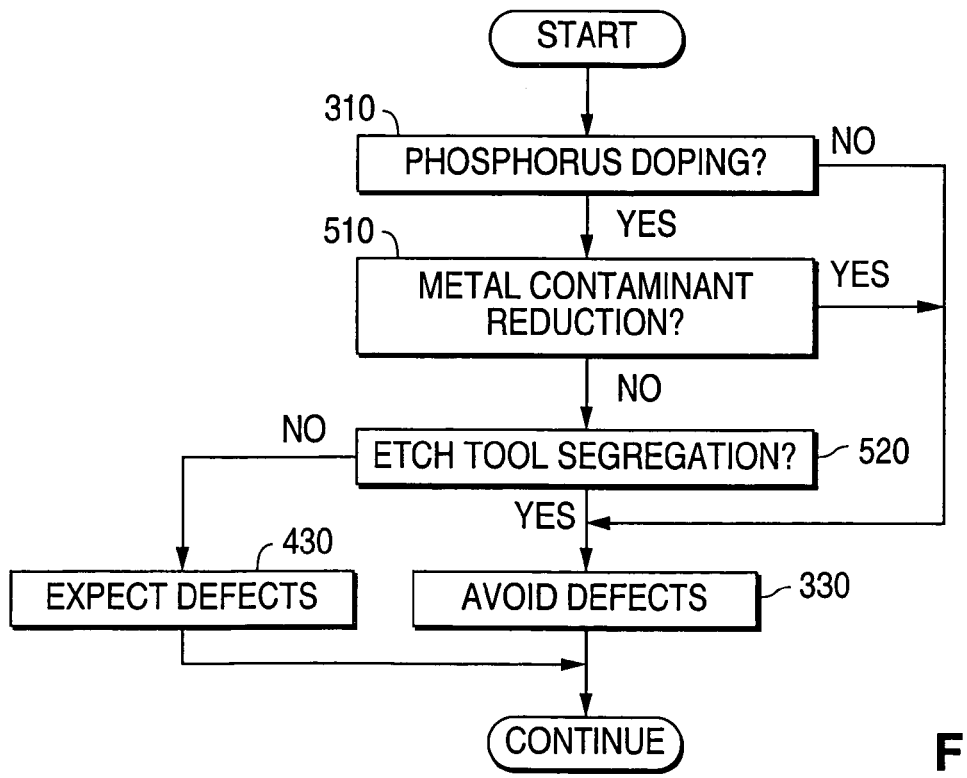
FIG. 5 illustrates more detailed examples of the method shown in FIG. 3.

FIGS. 4 and 5 illustrate more detailed examples of the procedure shown in FIG. 3. In FIG. 4, if a phosphorus-doped base dielectric is selected ("Yes" branch at step 310), then spongy cap dielectric defects can be avoided (step 330) by utilizing etch tool segregation ("Yes" branch at step at 410). On the other hand, if etch tool segregation is not selected at step 410 ("No" branch at step 410), then defects can still be avoided (step 330) by utilizing residual metal contaminant reduction ("Yes" branch at step 420). On the other hand, if residual metal contaminant reduction is not selected ("No" branch at step 420), then defects can be expected (step 430).

FIG. 5 is similar to FIG. 4, but illustrates the decision sequence in another order. If a phosphorus-doped base dielectric is used ("Yes" branch at step 310), then defects can be avoided (step 330) by utilizing residual metal contaminant reduction ("Yes" branch at step 510). On the other hand, if residual metal contaminant reduction is not selected ("No" branch at step 510), then defects can still be avoided (step 330) by utilizing etch tool segregation ("Yes" branch at step 520). Otherwise, if etch tool segregation is not selected ("No" branch at step 520), then defects can be expected (step 430).

Figure 6:
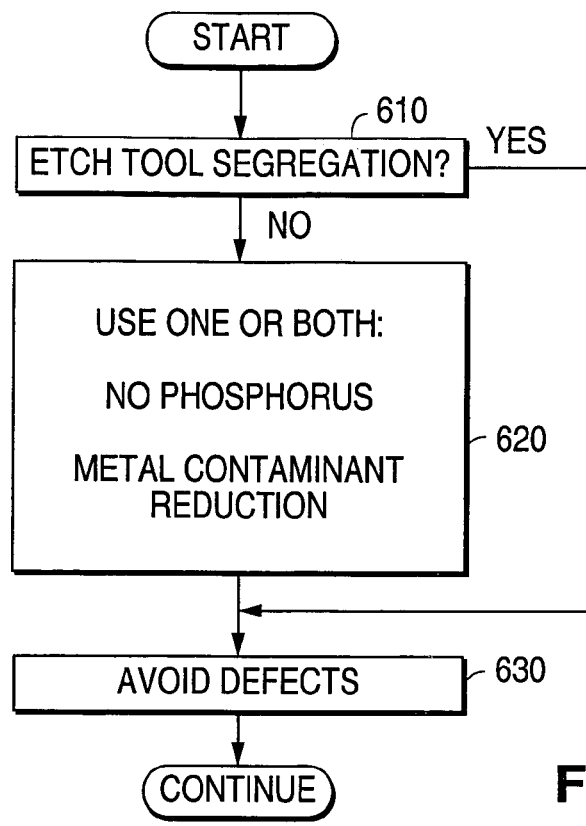
FIG. 6 illustrates exemplary embodiments according to the invention of a method for avoiding defects in an upper dielectric layer of a SOG planarization when the etch tool used for SOG etchback was last used for bond pad etch processing.

Referring to FIG. 6, if etch tool segregation is employed ("Yes" branch at step 610), then the risk of defects can be avoided (step 630). Otherwise, if etch tool segregation is not selected ("No" branch at step 610), then either or both of a non-phosphorus base dielectric and/or residual metal contaminant reduction can be utilized (step 620) in order to avoid defects (step 630).

Figure 7:
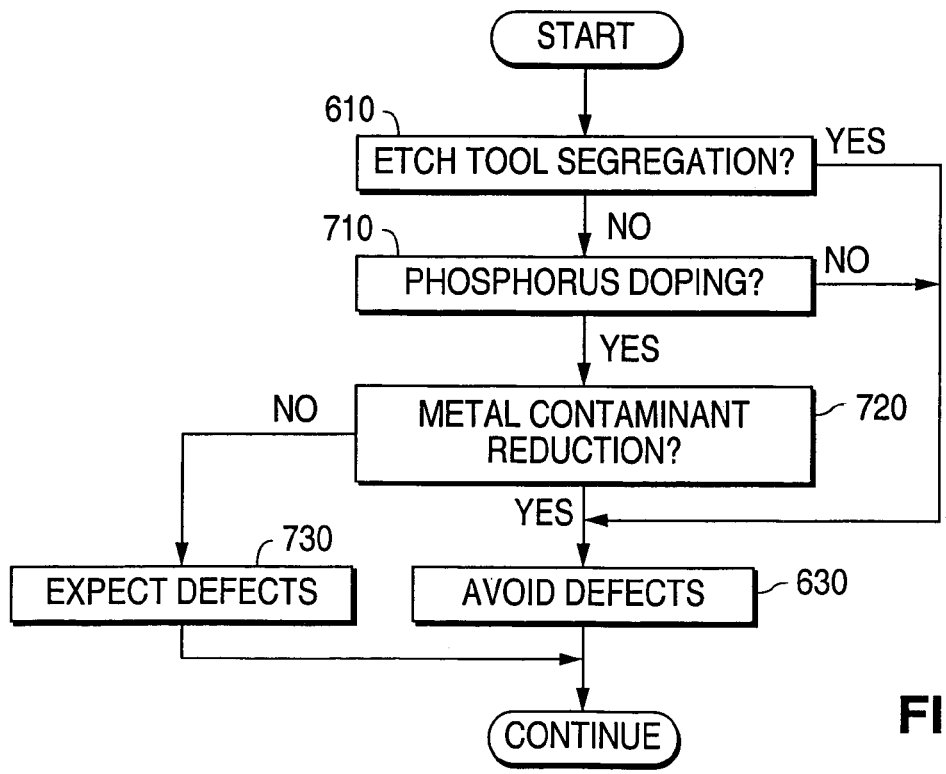
FIG. 7 illustrates more detailed examples of the method shown in FIG. 6.
Figure 8:
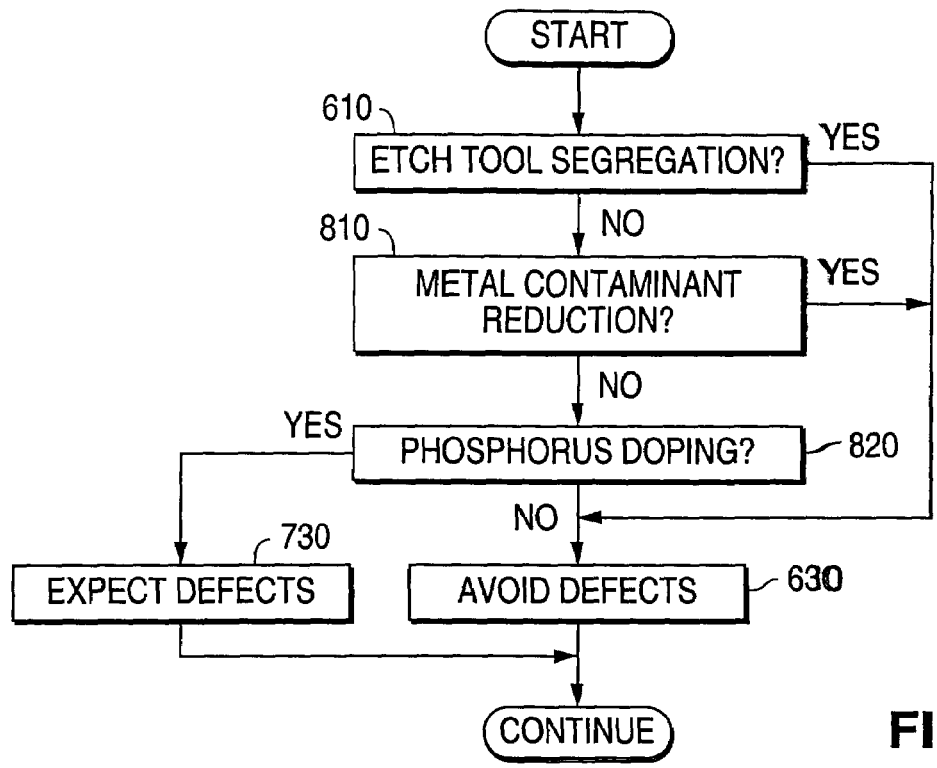
FIG. 8 illustrates more detailed examples of the method shown in FIG. 6.

FIGS. 7 and 8 illustrate more detailed examples of the procedure in FIG. 6. In FIG. 7, if etch tool segregation is not used ("No" branch at step 610), defects can be avoided (step 630) by utilizing a non-phosphorus base dielectric ("No" branch at step 710). Otherwise, if a phosphorus-doped base dielectric is selected ("Yes" branch at step 710), then defects can still be avoided (step 630) by reducing the level of residual metal contaminants ("Yes" branch at step 720). Otherwise, if residual metal contaminant reduction is not selected ("No" branch at step 720), then defects can be expected (step 730).

In FIG. 8 is similar to FIG. 7, but illustrates the decision sequence in another order. If etch tool segregation is not utilized ("No" branch at step 610), then defects can be avoided (step 630) by reducing the level of residual metal contaminants ("Yes" branch at step 810). Otherwise, if residual metal contaminant reduction is not selected ("No" branch at step 810), then defects can still be avoided (step 630) by employing a non-phosphorus base dielectric ("No" branch at step 820). Otherwise, if a phosphorus-doped base dielectric is selected ("Yes" branch at step 820), then defects can be expected (step 730).

Figure 9:
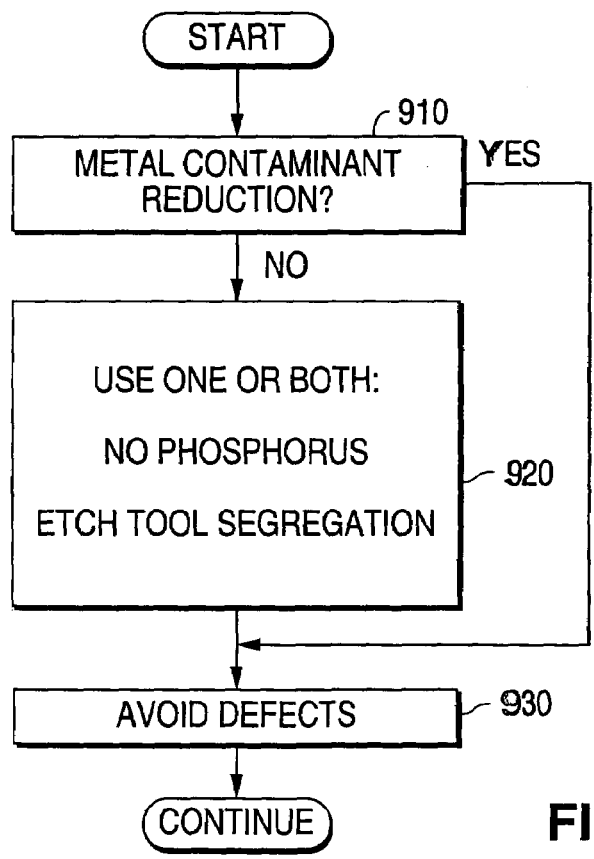
FIG. 9 illustrates exemplary embodiments according to the invention of a method for avoiding defects in an upper dielectric layer of a SOG planarization regardless of any residual metal contaminants present in the etch chamber used for SOG etchback.

Referring to FIG. 9, defects can be avoided (step 930) by reducing the residual metal contaminant level ("Yes" branch at step 910). Otherwise, if residual metal contaminant reduction is not selected ("No" branch at step 910), then either or both of a non-phosphorus base dielectric and/or etch tool segregation can be used (step 920) in order to avoid defects (step 930).

Figure 10:
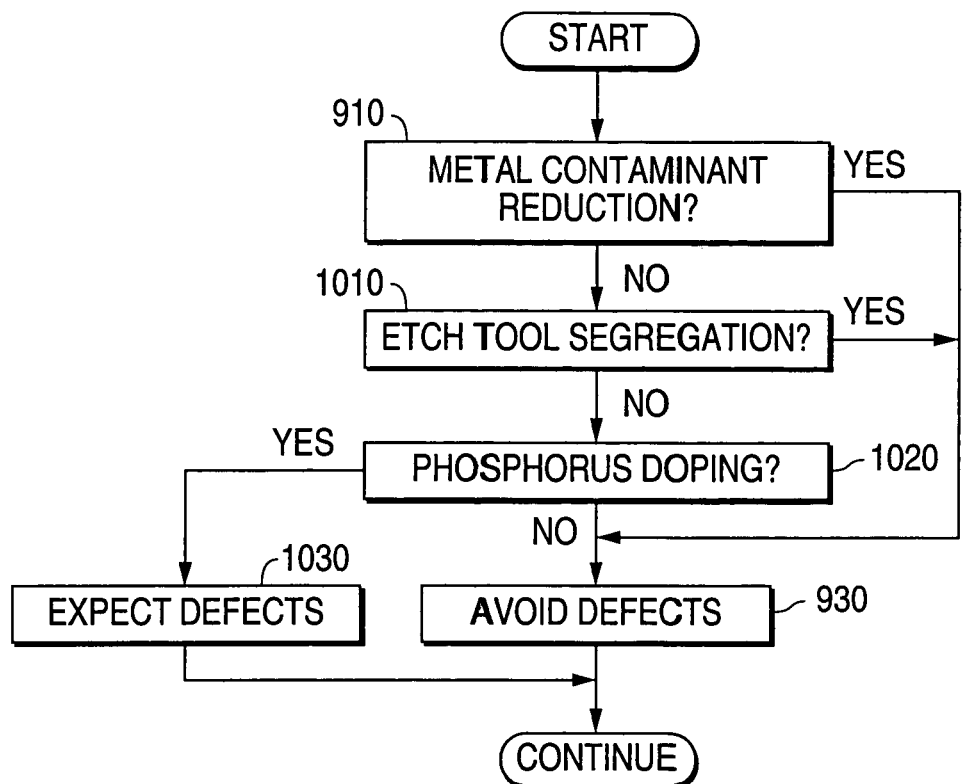
FIG. 10 illustrates more detailed examples of the method shown in FIG. 9.
Figure 11:
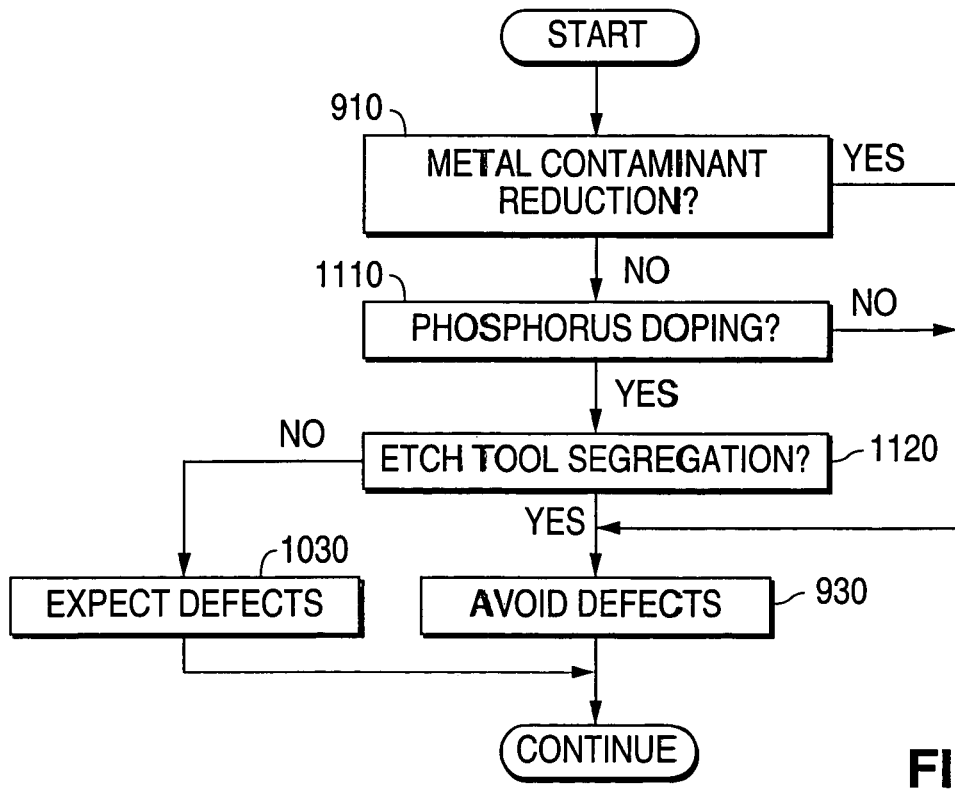
FIG. 11 illustrates more detailed examples of the method shown in FIG. 9.

FIGS. 10 and 11 illustrate more detailed examples of the procedure in FIG. 9. In FIG. 10, if residual metal contaminant reduction is not utilized ("No" branch at step 910), then defects can be avoided (step 930) by employing etch tool segregation ("Yes" branch at step 1010). On the other hand, if etch tool segregation is not selected ("No" branch at step 1010), then defects can still be avoided (step 930) by using a non-phosphorus base dielectric ("No" branch at step 1020). On the other hand, if a phosphorus-doped base dielectric is selected ("Yes" branch at step 1020), then defects can be expected (step 1030).

FIG. 11 is similar to FIG. 10, but illustrates the decision sequence in another order. In FIG. 11, if residual metal contaminant reduction is not employed ("No" branch at step 910), then defects can still be avoided (step 930) by utilizing a non-phosphorus base dielectric ("No" branch at step 1110). Otherwise, if a phosphorus-doped base dielectric is selected ("Yes" branch at step 1110), then defects can still be avoided (step 930) by utilizing etch tool segregation ("Yes" branch at step 1120). Otherwise, if etch tool segregation is not selected ("No" branch at step 1120), then defects can be expected (step 1030).

Although the present invention has been described with an exemplary embodiment, various changes and modifications may be suggested to one skilled in the art. It is intended that the present invention encompass such changes and modifications as fall within the scope of the appended claims.

What is claimed is:

1. A method of processing a lot of integrated circuit wafers, comprising:
   depositing a base dielectric on each wafer;
   depositing Spin On Glass (SOG) on the base dielectric of each wafer;
   performing a SOG etchback process on the SOG of each wafer in an etch chamber;
   depositing a further dielectric on each wafer; and
   preventing void defects from forming in said further dielectric, wherein preventing the void defects comprises forming the base dielectric without phosphorus doping and reducing a level of metal contaminant in the etch chamber by processing a plurality of dummy wafers in the etch chamber before processing the lot of integrated circuit wafers in the etch chamber.

2. The method of claim 1, wherein said preventing step includes excluding from use in said SOG etchback process any etch tool that was last used to perform a bond pad etch process on a different lot of wafers.

3. The method of claim 1, wherein the base dielectric is non-phosphorus TEOS.

4. The method of claim 1, wherein said performing step includes using an etch tool which was last used to perform a bond pad etch process on a different lot of wafers, and wherein said preventing step includes compensating for said last use of said etch tool in order to avoid forming said void defects.

5. The method of claim 4, wherein said performing step includes performing the SOG etchback process in said etch chamber regardless of a previously existing metal contaminant in said etch chamber.

6. The method of claim 1, wherein said performing step includes performing the SOG etchback process in said etch chamber regardless of a previously existing metal contaminant in said etch chamber, and wherein said preventing step includes compensating for said disregard of previously existing metal contaminants in order to avoid forming said void defects.

7. The method of claim 6, wherein said preventing step includes excluding from use in said SOG etchback process any etch tool that was last used to perform a bond pad etch process on a different lot of wafers.

8. A method of processing a lot of integrated circuit wafers, comprising:
   depositing a base dielectric on each wafer;
   depositing Spin On Glass (SOG) on the base dielectric of each wafer;
   performing a SOG etchback process on the SOG of each wafer in an etch chamber;
   depositing a further dielectric on each wafer; and preventing void defects from forming in said further dielectric, wherein preventing the void defects comprises excluding from use in the SOG etchback process any etch tool that was last used to perform a bond pad etch process on a different lot of wafers and reducing a level of metal contaminant in the etch chamber by processing a plurality of dummy wafers in the etch chamber before processing the lot of integrated circuit wafers in the etch chamber.

9. The method of claim 8, wherein said preventing step includes providing said base dielectric without phosphorus doping.

10. The method of claim 8, wherein said base dielectric is a phosphorus-doped dielectric, and wherein said preventing step includes compensating for said phosphorus-doped dielectric in order to avoid forming said void defects.

11. The method of claim 8, wherein said performing step includes performing the SOG etchback process in said etch chamber regardless of a previously existing metal contaminant in the etch chamber, and wherein said preventing step includes compensating for said disregard of previously existing metal contaminant in order to avoid forming said void defects.

12. The method of claim 11, wherein said base dielectric is a phosphorus-doped dielectric.

13. A method of processing a lot of integrated circuit wafers, comprising:
   depositing a base dielectric on each wafer;
   depositing Spin On Glass (SOG) on the base dielectric of each wafer;
   in an etch chamber, performing a SOG etchback process on each wafer;
   depositing a further dielectric on each wafer; and
   preventing void defects from forming in said further dielectric, wherein preventing the void defects comprises processing a plurality of dummy wafers in the etch chamber before processing the lot of integrated circuit wafers in the etch chamber, thereby reducing a level of metal contaminant in the etch chamber used to perform the SOG etchback process.

14. The method of claim 13, wherein said preventing step includes providing said base dielectric without phosphorus doping.

15. The method of claim 13, wherein the plurality of dummy wafers is processed in the same etch chamber as the lot of integrated circuit wafers.

16. The method of claim 13, wherein said base dielectric is a phosphorus-doped dielectric, and wherein said preventing step includes compensating for said phosphorus-doped dielectric in order to avoid forming said void defects.

17. The method of claim 13, wherein said performing step includes using an etch tool which was last used to perform a bond pad etch process on a different lot of wafers, and wherein said preventing step includes compensating for said last use of said etch tool in order to avoid forming said void defects.

18. The method of claim 17, wherein said base dielectric is a phosphorus-doped dielectric.

19. The method of claim 17, wherein said preventing step includes providing said base dielectric without phosphorus doping.

20. A method of processing a lot of integrated circuit wafers, comprising:
   depositing a base dielectric on each wafer;
   depositing Spin On Glass (SOG) on each wafer;
   in an etch chamber, performing a SOG etchback process on each wafer;
   depositing a further dielectric on each wafer; and
   preventing void defects from forming in said further dielectric by:
      excluding from use in the SOG etchback process any etch tool that was last used to perform a bond pad etch process on a different lot of wafers;
      before the performing step, reducing a level of metal contaminant in the etch chamber by processing a plurality of dummy wafers in the etch chamber before processing the lot of integrated circuit wafers in the etch chamber; and
      providing the base dielectric without phosphorus doping.

* * * * *